(12) United States Patent
Zhang et al.

(10) Patent No.: US 10,535,759 B2
(45) Date of Patent: Jan. 14, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Zhuo Fan Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/964,738

(22) Filed: Apr. 27, 2018

(65) Prior Publication Data
US 2018/0323289 A1    Nov. 8, 2018

(30) Foreign Application Priority Data
May 5, 2017  (CN) .......................... 2017 1 0310410

(51) Int. Cl.
*H01L 27/11556* (2017.01)
*H01L 29/66* (2006.01)
(Continued)

(52) U.S. Cl.
CPC .. *H01L 29/66818* (2013.01); *H01L 27/11556* (2013.01); *H01L 29/41791* (2013.01); *H01L 29/7856* (2013.01)

(58) Field of Classification Search
CPC ......... H01L 29/66742–6678; H01L 29/66818; H01L 29/41791; H01L 29/7856;
(Continued)

(56) References Cited

U.S. PATENT DOCUMENTS

| 6,031,261 A * | 2/2000 | Kang ................ H01L 21/26533 |
| | | 257/302 |
| 2006/0055392 A1* | 3/2006 | Passmore ............... B82Y 15/00 |
| | | 324/71.1 |

(Continued)

*Primary Examiner* — Eric A. Ward
*Assistant Examiner* — Eric K Ashbahian
(74) *Attorney, Agent, or Firm* — Anova Law Group, PLLC (57) ABSTRACT

Semiconductor devices and fabrication methods are provided. A fabrication method includes: forming a source and drain material layer over a substrate; forming a mask layer over the source and drain material layer and including a first trench exposing a portion of the source and drain material layer; forming a protective layer on sidewalls of the first trench; forming a second trench in the source and drain material layer using the mask layer and the protective layer as an etch mask; removing the protective layer after the second trench is formed; forming a channel material layer and a gate structure on the channel material layer after the protective layer is removed; and removing the mask layer after the channel material layer and the gate structure are formed. The channel material layer is on the sidewalls and the bottom of the first trench and the second trench.

16 Claims, 7 Drawing Sheets

(51) Int. Cl.
*H01L 29/78* (2006.01)
*H01L 29/417* (2006.01)

(58) Field of Classification Search
CPC ..... H01L 29/0665–068; H01L 29/1606; H01L 51/0508–057; H01L 27/11556; H01L 27/11582; H01L 21/02568
See application file for complete search history.

(56) References Cited

U.S. PATENT DOCUMENTS

| | | | |
|---|---|---|---|
| 2009/0184389 A1* | 7/2009 | Bertin | H01L 29/861 257/476 |
| 2011/0147742 A1* | 6/2011 | Sambandan | H01L 29/42384 257/57 |
| 2012/0049247 A1* | 3/2012 | Lee | H01L 21/28114 257/288 |
| 2015/0041905 A1* | 2/2015 | Xie | H01L 29/6656 257/369 |
| 2015/0243884 A1* | 8/2015 | BrightSky | H01L 45/06 257/4 |
| 2016/0218208 A1* | 7/2016 | Trautmann | H01L 21/3083 |
| 2016/0358905 A1* | 12/2016 | Balakrishnan | H01L 27/0629 |
| 2016/0379901 A1* | 12/2016 | Lin | H01L 21/02568 257/29 |
| 2017/0263782 A1* | 9/2017 | Yamazaki | H01L 29/78648 |
| 2018/0047851 A1* | 2/2018 | Yan | H01L 29/41733 |

\* cited by examiner

SEMICONDUCTOR DEVICE AND FABRICATION METHOD THEREOF

CROSS-REFERENCES TO RELATED APPLICATION

This application claims the priority of Chinese Patent Application No. 201710310410.X, filed on May 5, 2017, the content of which is incorporated by reference in its entirety.

TECHNICAL FIELD

The present disclosure generally relates to the field of semiconductor technology and, more particularly, relates to semiconductor devices and fabrication methods of the semiconductor devices.

BACKGROUND

The MOS (metal-oxide-semiconductor) transistor is one of the most important elements in modern integrated circuits. The basic structure of the MOS transistor includes a semiconductor substrate, and a gate structure located on the surface of the semiconductor substrate. And the gate structure includes: a gate dielectric layer located on the surface of the semiconductor substrate; a gate electrode layer located on the surface of the gate dielectric layer; and a source and drain doped region located in the semiconductor substrate at the two sidewalls of the gate structure.

With the development of semiconductor technology, the control capability of the traditional planar MOS transistor on the channel current is weakened, and serious leakage current is produced as a result. The fin field effect transistor is an emerging multi-gate device, the semiconductor substrate generally includes a fin structure which protrudes out of the surface of the semiconductor substrate, a gate structure covering the top surface and the sidewalls of the fin, and a source and drain doped region located in the fin portions on the two sides of the gate structure.

With the further development of the semiconductor technology, there are higher requirements for control capability of the channel current for not only the planar MOS transistor but also the fin field effect transistor. For this reason, a semiconductor device with an ultra-thin channel was used. However, the performance of conventional semiconductor devices having an ultra-thin channel still needs to be improved. The disclosed devices and methods are directed to at least partially alleviate one or more problems set forth above and to solve other problems in the art.

SUMMARY

One aspect of the present disclosure provides a method for forming a semiconductor device. The method includes: providing a substrate; forming a source and drain material layer over the substrate; forming a mask layer on the source and drain material layer, and the mask layer includes a first trench and the first trench exposes a portion of the source and drain material layer; forming a protective layer on sidewalls of the first trench; forming a second trench in the source and drain material layer by etching the source and drain material layer at a bottom of the first trench using the mask layer and the protective layer as a mask; removing the protective layer after the second trench is formed; forming a channel material layer and a gate structure on the channel material layer after the protective layer is removed, and the channel material layer is on the sidewalls and the bottom of the first trench and on sidewalls and bottom of the second trench; and removing the mask layer after the channel material layer and the gate structure are formed.

Another aspect of the present disclosure provides a semiconductor device. The semiconductor device includes: a substrate; a source and drain material layer formed on the substrate, the source and drain material layer containing a first trench there-through; a mask layer formed on the source and drain material layer containing a second trench there-through, the second trench having a cross-section area larger than the first trench and covers the first trench; a channel material layer conformally formed on a bottom and sidewalls of each of the first trench and the second trench; and a gate structure conformally formed on the channel material layer, on the bottom and the sidewalls of each of the first trench and the second trench.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
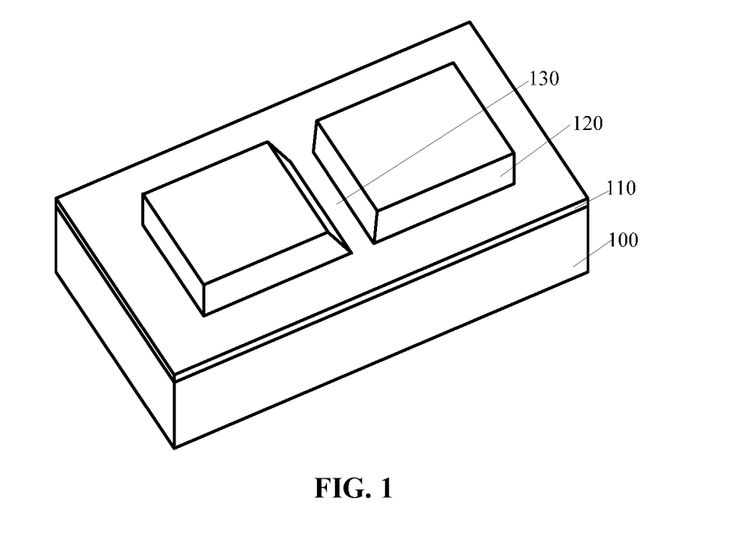
FIG. 1 and FIG. 2 are schematic structural diagrams illustrating a process of forming a semiconductor device.
Figure 2:
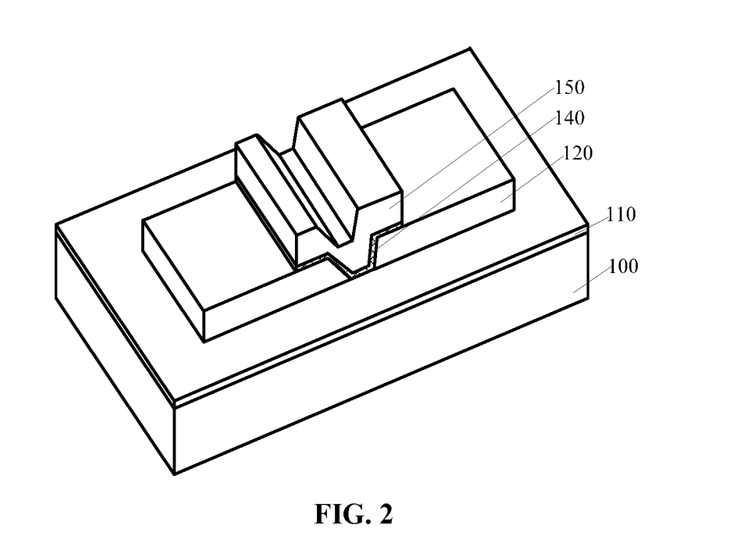

FIG. 1 and FIG. 2 are schematic structural diagrams illustrating a process of forming a semiconductor device. In FIG. 1, a substrate 100 is provided, and an oxide layer 110 is formed on the substrate 100. A source and drain material layer 120 is formed on the oxide layer 110, and the source and drain material layer 120 is provided with a trench 130 passing through the source-drain material layer 120.

In FIG. 2, a channel material film (not shown) is formed on the two sidewalls and the bottom portions of trench 130 (refer to FIG. 1), the source drain material layer 120, and the substrate 100. The material of the channel material film may be $MoS_2$. A gate structure material layer may be formed on the surface of the channel material film. A patterned gate structure material layer and the channel material film form a channel material layer 140 and a gate structure 150 on the top of channel material layer 140. The gate structure 150 corresponds to the gate structure material layer.

After the channel material layer 140 and the gate structure 150 are formed, the method further includes the following step: the source and drain ions are doped in the source and drain material layer 120 on the two sides of the gate structure 150; and a source and drain doped region is formed in the source and drain material layer 120 on the two sides of the gate structure 150.

However, the performance of the semiconductor device formed by the above method needs to be improved. The channel material layer 140 is located not only on the sidewalls and the bottom of the trench 130, but also on the source and drain material layer 120 on the two sides of the trench 130. As a result, the effective length of the channel material layer 140 is relatively large, and distance between the source and drain doped regions on the two sides of the gate structure 150 is also relatively large.

The method for forming the patterned gate structure material layer and the channel material film includes: forming a patterned photoresist layer on the gate structure material layer, and the photoresist layer only covers the gate structure material layer in the trench 130 and the portion of gate structure material layer located on the source and drain material layer 120 on the two sides of the trench 130; and etching the gate structure material layer and the channel material film by using the patterned photoresist layer as a mask until the source and drain material layer 120 is exposed.

The trench 130 may have a first sidewall and a second sidewall, facing each other. The first sidewall and the second sidewall of the trench 130 are respectively on the source and drain material layer 120.

Due to the influence of the photo etching alignment deviation, the position of the projection of the center of the gate structure 150 on the surface of the substrate 100 may be offset from the position of the projection of the center of the trench 130 on the surface of the substrate 100. The position of the projection of the center of the channel material layer 140 on the surface of the substrate 100 may also be offset from the position of the projection of the center of the trench 130 on the surface of the substrate 100. The size difference between the channel material layer 140 on the first side of the trench 130 and the second side of the trench 130 is relative large, and the gate structure 150 on the first side of the trench 130 and the gate structure 150 on the second side of the trench 130 are also different in size. Thus, the size of the source and drain doped region formed in the source and drain material layer 120 are very different from each other on the two sides of the trench, and the parameters of the current and the process design in the source-drain doped region. As a result, the stability of the electrical properties of the semiconductor device may be lowered.

The present disclosure provides a semiconductor device and a method for forming the semiconductor device. The method includes: providing a substrate; forming a source and drain material layer over the substrate; forming a mask layer on the source and drain material layer, and the mask layer includes a first trench and the first trench exposes a portion of the source and drain material layer; forming a protective layer on sidewalls of the first trench; forming a second trench in the source and drain material layer by etching the source and drain material layer at a bottom of the first trench using the mask layer and the protective layer as a mask; removing the protective layer after the second trench is formed; forming a channel material layer and a gate structure on the channel material layer after the protective layer is removed, and the channel material layer is on the sidewalls and the bottom of the first trench and on sidewalls and bottom of the second trench; and removing the mask layer after the channel material layer and the gate structure are formed.

With this method, the sizes of the source drain material layers on the two sides of the gate structure are consistent, and the stability of the electrical performance of the semiconductor device may be improved.

Figure 3:
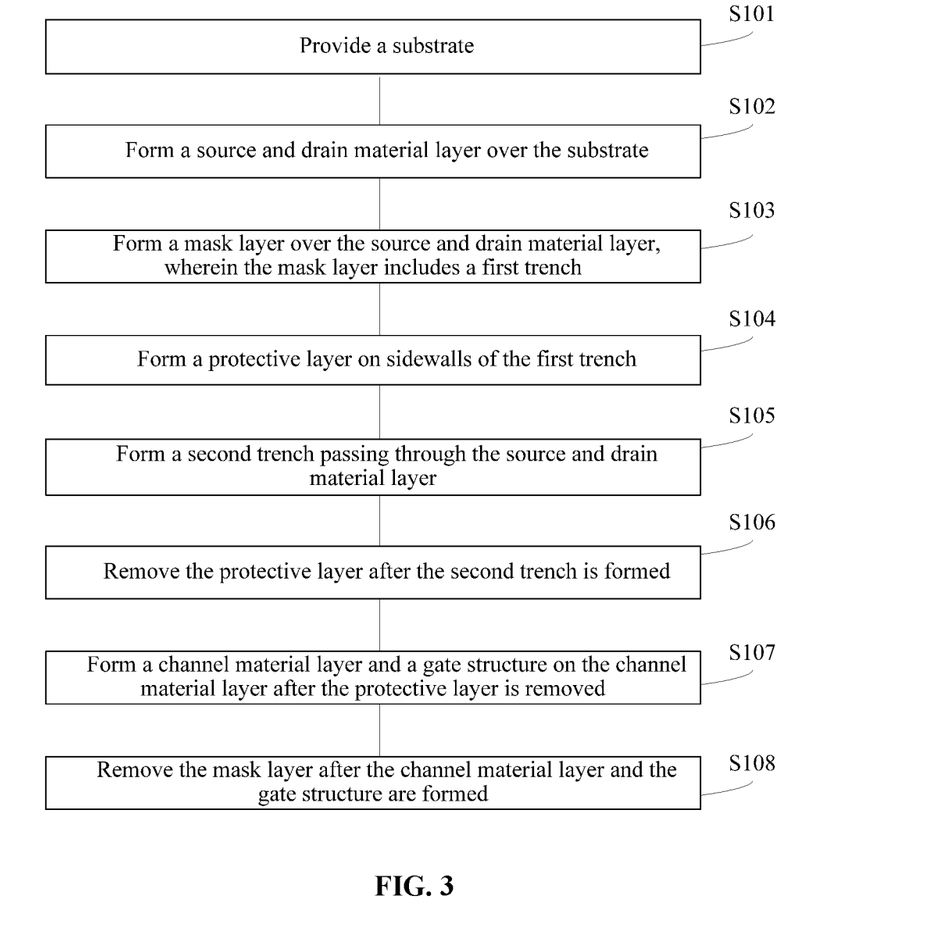
FIG. 3 illustrates an exemplary method for forming a semiconductor device according to the disclosed embodiments.

In accordance with some embodiments of the present disclosure, FIG. 3 is a flowchart illustrating a method for forming a semiconductor device. At step S101, a substrate is provided. A source and drain material layer is formed on the substrate at step S102. At step S103, a mask layer, which includes a first trench and the first trench exposes a portion of the source and drain material layer, is formed on the source and drain material layer. A protective layer is formed on sidewalls of the first trench at step S104. At step S105, a second trench passing through the source and drain material layer is formed by etching the source and drain material layer at a bottom of the first trench using the mask layer and the protective layer as a mask. The protective layer is removed after the second trench at step S106. At step S107, a channel material layer and a gate structure are formed on the channel material layer after the protective layer is removed, and the channel material layer is located on the sidewalls and the bottom of the first trench and the second trench. And at step 108, the mask layer is removed after the channel material layer and the gate structure are formed.

FIGS. 4-13 illustrate semiconductor structures corresponding to certain stages of an exemplary fabrication process of a transistor consistent with the disclosed embodiments.

Figure 4:
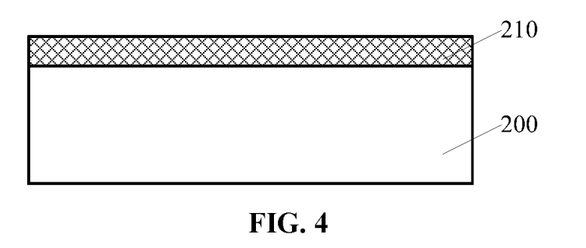
FIGS. 4-13 illustrate semiconductor structures corresponding to certain stages of an exemplary fabrication process of a transistor consistent with the disclosed embodiments.

As shown in FIG. 4, a substrate 200 is provided.

The substrate 200 may be a bulk silicon substrate, a bulk germanium substrate, a glass substrate, a silicon-on-insulator substrate, or a germanium-on-insulator substrate. In one embodiment, the substrate 200 may be a bulk silicon substrate.

In one embodiment, an interface layer 210 may be formed on the surface of the substrate 200.

The material of the interface layer 210 may be silicon oxide.

The interface layer 210 may isolate the substrate 200 from a subsequently formed source and drain material layer.

Figure 5:
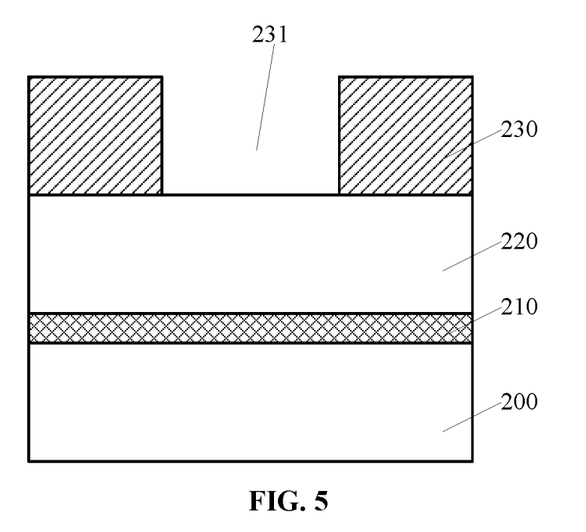

In FIG. 5, a source and drain material layer 220 may be formed on the substrate 200 and a mask layer 230 may be formed on the source and drain material layer 220, the mask layer 230 may include a first trench 231, and a portion of the source and drain material layer 220 may be exposed in the first trench 231.

In one embodiment, the interface layer 210 may be formed on the surface of the substrate 200 before the source and drain material layer 220 is formed.

The material of the source and drain material layer 220 may be, for example, polycrystalline silicon.

The process for forming the source and drain material layer 220 may be a deposition process, such as a plasma chemical vapor deposition process, a low-pressure chemical vapor deposition process, or a sub-atmospheric pressure chemical vapor deposition process.

The method for forming a mask layer 230 includes: forming a mask material layer on the source and drain material layer 220; and forming the mask layer 230 by patterning the mask material layer. The mask layer 230 may include the first trench 231 passing through the mask layer 230.

The mask layer 230 may be made of, for example, silicon oxide.

Figure 6:
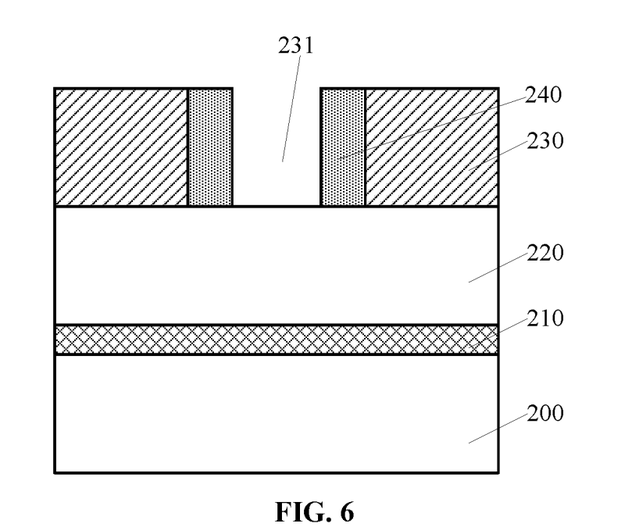

In FIG. 6, a protective layer 240 may be formed on the sidewalls of the first trench 231.

The mask layer 230 and the protective layer 240 are used jointly to define the position of a subsequent formed second trench.

The protective layer 240 may be formed by, for example, forming a protective material layer (not illustrated) on the sidewalls and the bottom of the first trench 231 and on the top surface of the mask layer 230; and forming the protective layer 240 by etching back the protective material layer until the top surface of the mask layer 230 and the top surface of the source and drain material layer 220 are exposed.

The process for forming the protective material layer may be a deposition process, such as an atomic layer deposition process, a plasma chemical vapor deposition process, a low-pressure chemical vapor deposition process, or a sub-atmospheric chemical vapor deposition process.

The material of the protective layer 240 and the material of the mask layer 230 are different. The protective layer 240 and the source and drain material layer 220 may also be made of different materials.

In the process of etching back the protective material layer, the protective material layer may have a relatively high etching selection ratio value comparing to the source and drain material layer 220. The protective material layer may have a higher etching selection ratio comparing to the mask layer 230. In the subsequent process of removing the protective layer 240, the protective layer 240 may have a higher etching selection ratio comparing to the source and drain material layer 220.

In one embodiment, the protective layer 240 may be made of silicon nitride.

Figure 7:
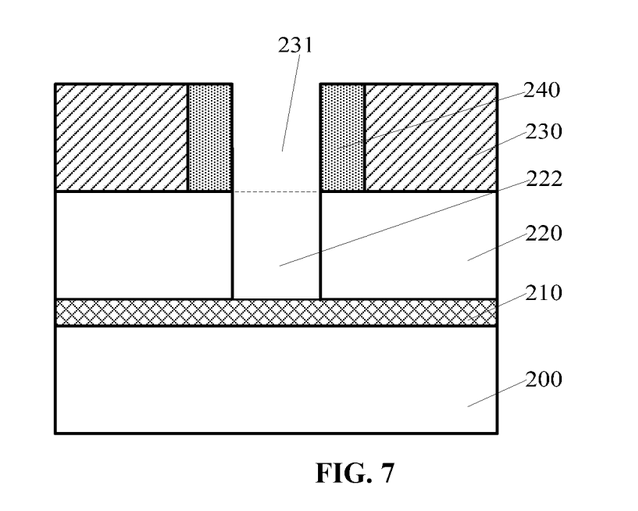

As shown in FIG. 7, the mask layer 230 and the protective layer 240 are used as a mask to etch the source and drain material layer 220 on the bottom of the first trench 231, and the source and drain material layer 220 may include a second trench 222 passing through the source and drain material layer 220.

Using the mask layer 230 and the protective layer 240 as a mask, the process of etching the source and drain material layer 220 on the bottom of the first trench 231 may be an anisotropic dry etching process.

In one embodiment, the process of etching the source and drain material layer 220 on the bottom of the first trench 231 may use the interface layer 210 as an etching stop layer.

It should be noted that in one embodiment, the interface layer 210 may be optionally formed on the surface of the substrate 200 before the source and drain material layer 220 is formed. Therefore, the interface layer 210 may be exposed on the bottom of the second trench 222.

By using the mask layer 230 and the protective layer 240 as a mask to etch the source and drain material layer 220 on the bottom of the first trench 231, the distances from the center of the second trench 222 to the two sidewalls of the first trench 231 are consistent with each other.

The first trench 231 may cover the second trench 222. The first trench 231 may have a cross-section area larger than the second trench 222. In one embodiment, projections of centers of the first and second trenches on a surface the substrate may be substantially overlapped.

Figure 8:
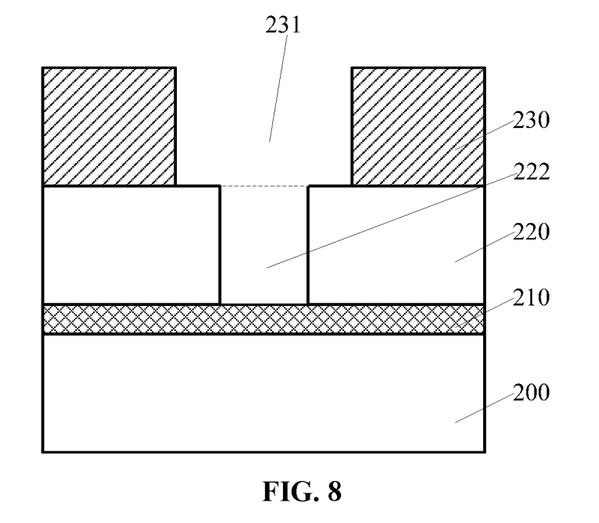

In FIG. 8, the protective layer 240 (see FIG. 7) may be removed after the second trench 222 is formed.

The process for removing the protective layer 240 may be an etching process, such as a dry etching process or a wet etching process.

In the process of removing the protective layer 240, the ratio of the etching rate between the protective layer 240 and the mask layer 230 may be in a range from 3 to 10.

In the process of removing the protective layer 240, the ratio of the etching rate between the protective layer 240 and the mask layer 220 may be in a range from 3 to 10.

A channel material layer and a gate structure on the channel material layer are formed after the protective layer 240 is removed. The channel material layer may be located on the sidewalls and the bottom of the first trench 231 and the sidewalls and the bottom of the second trench 222.

After the protective layer 240 is removed, the source and drain material layer 220, which is located on the two sides of the second trench 222 and on the bottom of the first trench 231, may be exposed. And the sizes of the source and drain material layer 220, located on the two sides of the second trench 222 and on the bottom of the first trench 231, are consistent with each other.

The method of forming the channel material layer and the gate structure is described below with reference to FIG. 9 and FIG. 10.

Figure 9:
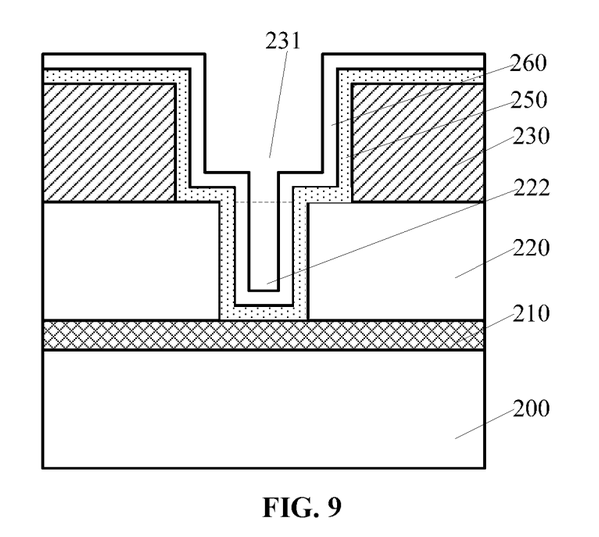

In FIG. 9, a channel material film 250 may be formed on the sidewalls and the bottom portion of the first trench 231, on the sidewalls and the bottom the second trench 222, and on the mask layer 230.

The channel material film 250 may further be formed on the surface of the interface layer 210.

The channel material film 250 may be used to form a channel material layer.

The material of the channel material film 250 may be $MoS_2$, and the process for forming the channel material film 250 may be a solid source chemical vapor deposition process.

The material of the subsequently formed channel material layer may be a crystalline material. The electrical conductivity of the crystalline state material may be high, and the channel material layer may have a good conductive property.

The material of the channel material film 250 may be $MoS_2$, and the channel material film 250 may be formed on the bottom of the second trench 222 by using a solid source chemical vapor deposition process. The channel material film 250 on the bottom of the second trench 222 may be used as a channel material layer on the bottom of the second trench 222.

In addition, when using $MoS_2$ as the material for the channel material film 250, the channel material film 250 may be ultra-thin.

The solid source chemical vapor deposition process includes: taking a solid as a generating source; evaporating and sublimating the solid source; and forming a channel material film 250 with decomposition reactions in the atmosphere of the carrier gas.

When the channel material film 250 is made of $MoS_2$, the parameters of the solid source chemical vapor deposition process may include: a solid source including $MoO_3$ and S; a carrier gas including Ar; and a temperature in a range of approximately 600° C.-900° C., such as 755° C.

The thickness of the channel material film 250 may be in a range of approximately 5 nm-10 nm, such as about 7 nm. Thickness of the subsequently formed channel material layer may be in a range of approximately 5 nm-10 nm. The present method may be used to form a semiconductor device with an ultra-thin channel.

The thickness of the channel material film 250 may be in a range from 5 nm to 10 nm. If the channel material film 250 is thinner than 5 nm, it will be too difficult to control the process; and if the channel material film 250 is thicker than 10 nm, the subsequently formed channel material layer may be too thick, and it will be too hard to improve the control capability of the gate structure on the channel.

As illustrated in FIG. 9, a gate structure material layer 260 may be formed on the surface of the channel material film 250.

The gate structure material layer 260 may include: a gate dielectric material layer (not shown) on the surface of the channel material film 250; and a gate electrode material layer (not shown) on the surface of gate dielectric material layer.

The material of the gate dielectric material layer may be a high-k (k may be greater than 3.9) dielectric material.

The gate electrode material layer may be made of metal, such as copper and/or tungsten.

The process for forming the gate dielectric material layer may be a deposition process, such as an atomic layer deposition process, a plasma chemical vapor deposition process, a low-pressure chemical vapor deposition process, or a sub-atmospheric chemical vapor deposition process.

The process for forming the gate electrode material layer may be a deposition process, such as a sputtering process or a plasma chemical vapor deposition process.

Figure 10:
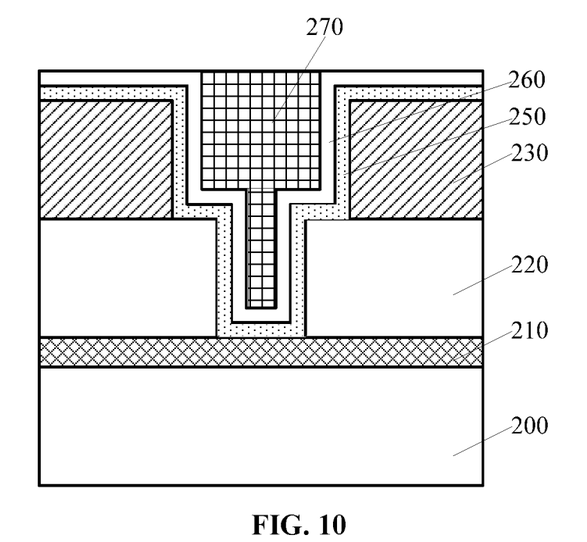

In FIG. 10, a filling layer 270 may be formed to fill in the first trench 231 (see FIG. 9) and the second trench 222 (see FIG. 9) after the gate structure material layer 260 is formed.

The material of the filling layer 270 may be made of silicon oxide or a bottom anti-reflective coating (BARC) material.

The process for forming the filling layer 270 may include a spin coating process.

Figure 11:
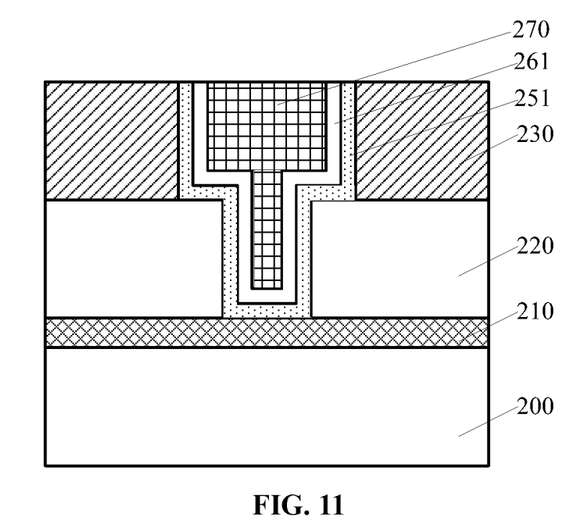

As shown in FIG. 11, the gate structure material layer 260 and the channel material film 250 are planarized until the top surface of the mask layer 230 and the top surface of the filling layer 270 are exposed. Then the channel material film 250 forms a channel material layer 251, and the gate structure material layer 260 forms a gate structure 261.

The process for planarizing the gate structure material layer 260 and the channel material film 250 may be a chemical mechanical grinding process.

The channel material layer 251 may be made of $MoS_2$.

The channel material layer 251 may be located not only on the sidewalls and the bottom of the second trench 222, but also on the bottom of the first trench 231. As a result, the effective length of the channel material layer 251 may be relatively big, and the distance between the source and drain doped regions on the two sides of the subsequent gate structure may be relatively big correspondingly. And the short channel effect of the semiconductor device may be improved.

The channel material layer 251 may be made of $MoS_2$. The advantages of using $MoS_2$ may include that the semiconductor device may be provided with an ultra-thin channel and the channel material layer 251 may be formed on the surface of the interface layer 210.

The thickness of the channel material layer 251 may be in a range of approximately 5 nm-10 nm.

The gate structure 261 may include a gate dielectric layer located on the channel material layer 251 and a gate electrode layer on the gate dielectric layer.

The gate dielectric layer corresponds to the gate dielectric material layer, and the gate electrode layer corresponds to the gate electrode material layer.

Figure 12:
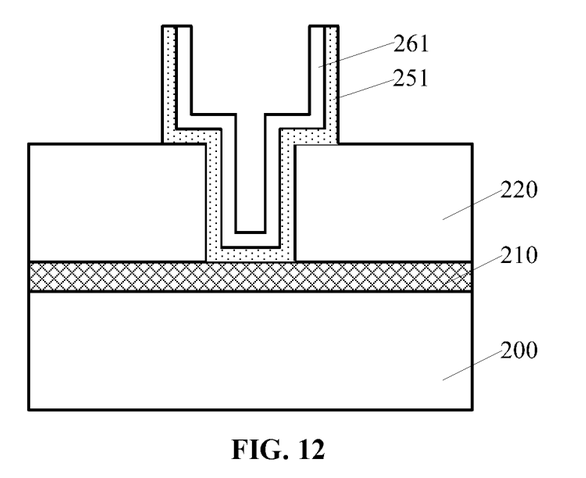

In FIG. 12, after the gate structure material layer 260 and the channel material film 250 are planarized, the filling layer 270 (see FIG. 11) may be removed.

In one embodiment, the method may further include removing the mask layer 230 (see FIG. 11) after forming a channel material layer 251 and a gate structure 261.

In one embodiment, the mask layer 230 may be removed in the process of removing the filler layer 270. The filling layer 270 and the mask layer 230 may be removed separately, in another embodiment.

In one embodiment, the filling layer 270 and the mask layer 230 may be removed by an etching process.

Figure 13:
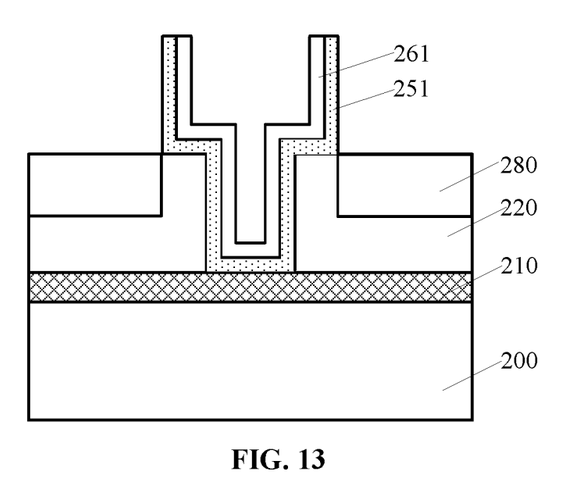

As shown in FIG. 13, after the mask layer 230 is removed, a source and drain doped region 280 may be formed on the two sides of the gate structure 261 in the source and drain material layer 220.

For example, source and drain ions may be injected into the source and drain material layer 220 on the two sides of the gate structure 261 by adopting an ion implantation process and a source and drain doped region 280 may be formed on the two sides of the gate structure 261 in the source and drain material layer 220.

After the channel material layer 251 and the gate structure 261 are formed, the size of the channel material layer 251 on the source and drain material layer 220 on one side of the second trench 222 may be consistent with that of the channel material layer 251 on the other side of the second trench 222. And the size of the gate structure 261 on the source and drain material layer 220 on one side of the second trench 222 may also be consistent with the size of the gate structure 261 on the other side of the second trench 222. Therefore, the sizes of the source and drain material layer 220 on the two sides of the gate structure 261 are consistent with each other, and the size of the source and drain doped region 280 may also be consistent. The self-aligned metal gate with channel substantially reduces the size difference of the source and drain material layer on the two sides of the gate structure 261. Therefore, the stability of the electrical performance of the semiconductor device may be improved.

As such, the source region and the drain region are formed in the source and drain material layer respectively on sides of the channel material layer. In one embodiment, projections of centers of the gate structure and the channel material layer on a surface the substrate may be substantially overlapped.

Correspondingly, the embodiment further provides a semiconductor device formed by the above discussed method. Comparing with the conventional techniques, the present disclosure has the following advantages. According to the forming method of the semiconductor device provided by present disclosure, the channel material layer is formed along the sidewalls and the bottom of the first trench and of the second trench, and an ultra-thin channel material layer is formed. The ultra-thin channel material layer limits the channel size of the semiconductor device, and the semiconductor device is provided with an ultra-thin channel. The channel material layer is located not only on the sidewalls and the bottom of the second trench, but also on the bottom of the first trench. Therefore, the effective length of the channel material layer is relatively large, and the short channel effect of the semiconductor device is further improved. Then a source and drain doped region is formed on the two sides of the gate structure in the source and drain material layer. A protective layer is formed on the sidewall of the first trench, and then the mask layer and the protective layer are used jointly to define the position of the second trench. The mask layer and the protective layer are used as a mask to etch the source and drain material layer on the bottom of the first trench, and the distances from the center of the second trench to the two sidewalls of the first trench are consistent with each other. The source and drain material layer, which is located on the two sides of the second trench and on the bottom of the first trench, is exposed after the protective layer is removed. The size of the source and drain material layer located on the two sides of the second trench and on the bottom of the first trench is also consistent with each other. After the channel material layer and the gate structure are formed, and the size of the channel material layer on the source/drain material layer on one side of the second trench is consistent with that of the channel material layer on the other side of the second trench. Similarly, the size of the gate structure on the source/drain material layer on one side of the second trench is consistent with that of the gate structure on the other side of the second trench. Therefore, the sizes of the source and drain material layer on the two sides of the gate structure are consistent with each other, and the stability of the electrical performance of the semiconductor device is improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
    providing a substrate;
    forming a source and drain material layer over the substrate;
    forming a mask layer over the source and drain material layer, wherein the mask layer includes a first trench and the first trench exposes a portion of the source and drain material layer;
    forming a protective layer on sidewalls of the first trench;
    forming a second trench in the source and drain material layer by etching the source and drain material layer at a bottom of the first trench using the mask layer and the protective layer as a mask;
    removing the protective layer after the second trench is formed;
    forming a channel material layer and a gate structure on the channel material layer after the protective layer is removed, the channel material layer being on the sidewalls and the bottom of the first trench and on sidewalls and bottom of the second trench, wherein:
        the gate structure has a recess and the recess has a symmetrical step structure,
        a portion of the channel material layer is on a top of the source and drain material layer and perpendicular to a top surface of the source and drain material layer, and
        projections of centers of the gate structure and projections of centers of the channel material layer on a top surface of the substrate are substantially overlapped; and
    removing the mask layer after the channel material layer and the gate structure are formed, wherein to expose a side surface of the channel material layer being on the sidewalls of the first trench.

2. The method according to claim 1, wherein:
    the protective layer is made of a material comprising silicon nitride, and
    the mask layer is made of a material comprising silicon oxide.

3. The method according to claim 1, wherein forming the protective layer comprises:
    forming a protective material layer on the sidewalls and the bottom of the first trench and on a top surface of the mask layer; and
    etching the protective material layer until the top surface of the mask layer and a top surface of the source and drain material layer are exposed.

4. The method according to claim 1, wherein forming the channel material layer and the gate structure comprises:
    forming a channel material film on the sidewalls and the bottom of the first trench, the sidewalls and the bottom of the second trench, and the mask layer;
    forming a gate structure material layer on a surface of the channel material film;
    forming a filling layer filling the first trench and the second trench, after the gate structure material layer is formed; and
    planarizing the gate structure material layer and the channel material film by removing a portion of the gate structure material layer and a portion of the channel material film until the top surface of the mask layer and the top surface of the filling layer are exposed, wherein a remaining channel material film forms the channel material layer and a remaining gate structure material layer forms the gate structure layer.

5. The method according to claim 4, wherein the filling layer is made of a material comprising silicon oxide or a bottom anti-reflective coating (BARC) material.

6. The method according to claim 4, wherein forming the filling layer is formed by a spin coating process.

7. The method according to claim 4, wherein planarizing the gate structure material layer and the channel material film comprises a chemical mechanical grinding process.

8. The method according to claim 4, further comprising:
    removing the filling layer after the gate structure material layer and the channel material film are planarizeded.

9. The method according to claim 8, further comprises removing the mask layer while removing the filling layer.

10. The method according to claim 4, wherein
    the channel material film is made of a material comprising $MoS_2$; and
    forming the channel material film comprises a solid source chemical vapor deposition process.

11. The method according to claim 10, wherein parameters of the solid source chemical vapor deposition process comprise:
    a solid source comprising $MoO_3$ and S;
    a carrier gas comprising Ar; and
    a temperature in a range of approximately 600° C.-900° C.

12. The method according to claim 1, wherein a thickness of the channel material layer is in a range of approximately 5 nm-10 nm.

13. The method according to claim 1, wherein the source and drain material layer is made of a material comprising polycrystalline silicon.

14. The method according to claim 1, wherein the gate structure layer comprises:
    a gate dielectric layer on the channel material layer; and
    a gate electrode layer on the gate dielectric layer.

15. The method according to claim 1, further comprising:
    forming an interface layer on a surface of the substrate before forming the source and drain material layer and the mask layer, wherein the source and drain material layer is then formed on a surface of the interface layer; and
    exposing the interface layer on the bottom of the second trench before the channel material layer is formed, wherein the channel material layer is then formed on the surface of the interface layer.

16. The method according to claim 1, further comprising forming a source-drain doped region in the source and drain material layer on sides of the channel material layer after the mask layer is removed.

\* \* \* \* \*